United States Patent [19]
Justus

[11] Patent Number: 5,277,411
[45] Date of Patent: Jan. 11, 1994

[54] SLIDE ACTUATED HOLDING CLAMP

[75] Inventor: George L. Justus, Northville, Mich.

[73] Assignee: United Technologies Automotive, Inc., Dearborn, Mich.

[21] Appl. No.: 927,450

[22] Filed: Aug. 7, 1992

[51] Int. Cl.$^5$ .............................................. B23Q 3/08
[52] U.S. Cl. ...................................... 269/32; 269/94; 269/233; 269/903
[58] Field of Search .................. 269/32, 93, 94, 237, 269/238, 233, 234, 903; 29/760, 281.1

[56] References Cited

U.S. PATENT DOCUMENTS

| | | | |
|---|---|---|---|
| 3,027,155 | 3/1962 | Paterson | 269/32 |
| 4,445,676 | 5/1984 | Tunkers | 269/32 |
| 4,451,026 | 5/1984 | Coope | 269/32 |
| 4,673,173 | 6/1987 | Shochi et al. | 269/32 |
| 4,723,767 | 2/1988 | McPherson et al. | 269/32 |
| 4,777,445 | 10/1988 | Kahl . | |
| 4,834,663 | 5/1989 | Kahl . | |

Primary Examiner—Robert C. Watson
Attorney, Agent, or Firm—Harness, Dickey & Pierce

[57] ABSTRACT

A slide actuated holding clamp for holding a connector block stationary while a push test is performed on a conductor secured to the connector. The clamp comprises a body portion having a bore extending longitudinally therethrough and a portion forming a channel. A locking member is pivotally disposed within the channel and includes a locking finger portion and a lower shoulder portion. An actuating member is slidably disposed within the channel and includes a pin member extending transversely therethrough which causes the locking member to move pivotally such that the locking finger portion is moved outwardly of the channel when the actuating member is moved in a first direction. When the actuating member is moved in a longitudinally opposite second direction, the pin member abuttingly engages the lower shoulder portion, thereby causing the locking member to move pivotally such that the locking finger portion is retracted to a position within the channel. A small, conventional air cylinder is coupled to the actuating member via a linkage rod and a clevis to urge the actuating member slidably in the first and second directions in response to the application of air pressure thereto. The clamp will hold a connector stationary while large push forces are exerted on conductors coupled to the connector with only a very small force applied by the air cylinder. The design of the clamp does not require the air cylinder to exert a counter force in proportion to the push force being exerted on the connector.

14 Claims, 2 Drawing Sheets

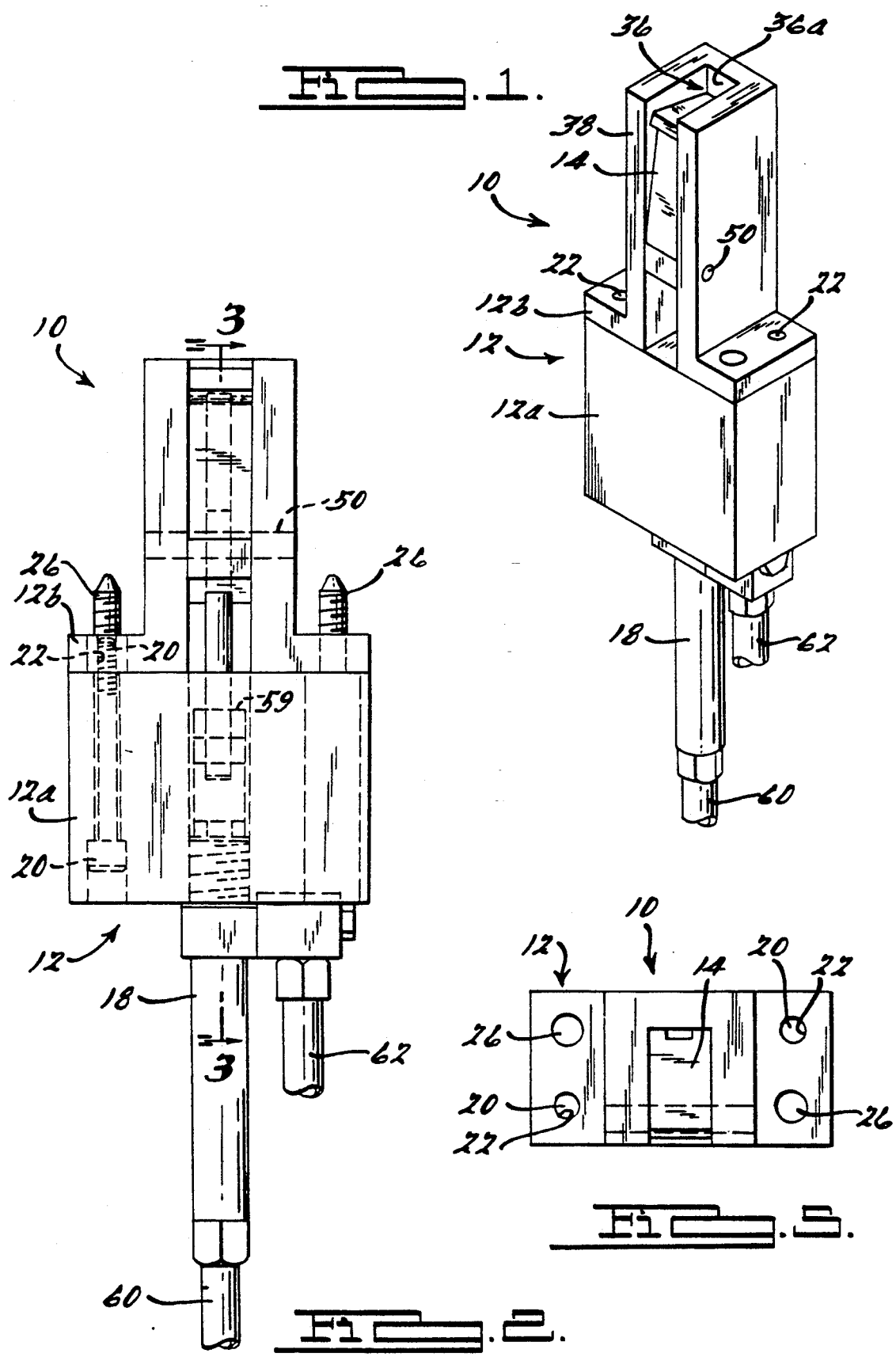

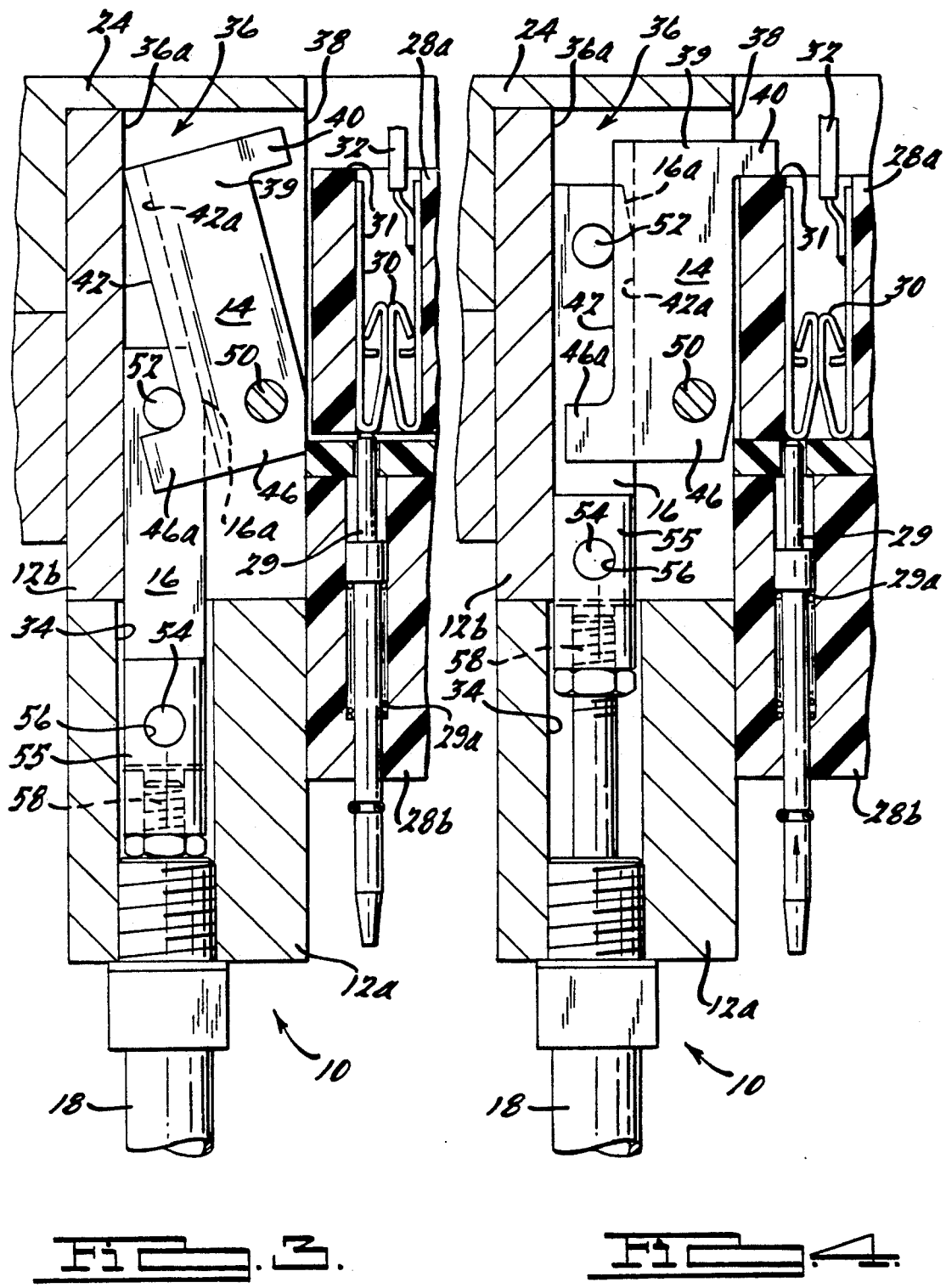

SLIDE ACTUATED HOLDING CLAMP

BACKGROUND OF THE INVENTION

1. Technical Field

This invention is related to clamping mechanisms, and more particularly to a slide actuated holding clamp for holding a connector of a vehicle wiring harness securely stationary while a push test is performed on a conductor secured to the connector.

2. Discussion

Clamping mechanisms are used in a wide variety of applications. One application in particular where such devices are helpful is in enabling off line harness testing to be performed on electrical connectors such as those used on a vehicle wiring harness. To help ensure that electrical terminals are going to remain coupled to their associated connectors and will not become disengaged from their connectors due to tension exerted along various lengths of the wiring harness, such as during the assembly of a vehicle, or from vibration, jarring, etc., "push tests" are frequently conducted on connector assemblies. Push tests involve applying a force to the end of a terminal of a conductor while the terminal is secured to its associated connector. Typically, a test force of about five pounds is applied to the terminal of the electrical conductor while the terminal is releasably secured to an associated connector.

In order to hold the connector stationary during a test the connector is typically fitted into a mounting block or a test module which consists of a pocket with some form of holding device coming over a rear end portion of the connector. Since many connectors have multiple terminals connected thereto, and often as many as fifty or more terminals to a single connector, when a five pound test force is applied to each terminal the total force exerted on the connector may range up to or over 250 pounds.

Previously designed holding devices typically used an air cylinder having a diameter which was required to be in proportion to the push force being applied to the connector. Accordingly, for connectors with many terminals a relatively large cylinder was required to supply an adequate holding force to securely hold the connector stationary in response to large push forces being exerted on the connector. Since there is generally very limited space in which to locate the air cylinder, the amount of holding force that could be applied to a connector, and thus the number of terminals that may be checked during a single push test, was limited to the construction of the mechanism and the diameter of the air cylinder which could be implemented into the mounting block or test module holding the connector under test.

Accordingly, it is a principal object of the present invention to provide a slide actuated holding clamp apparatus that is very compact and which is well adapted to fit many different test applications involving electrical connectors.

It is a further object of the present invention to provide a slide actuated holding clamp apparatus which is operable to securely hold a connector under test, where the connector has a relatively large plurality of terminals connected thereto, upon each of which is exerted a test push force of about five pounds, and which will hold the connector securely stationary with a minimum amount of force being exerted by active (i.e., moving) components of the clamp.

It is yet another object of the present invention to provide a slide actuated holding clamp apparatus which is relatively compact, inexpensive to manufacture, and adapted for use with a wide variety of electrical connectors.

It is still another object of the present invention to provide a slide actuated holding clamp apparatus which may be pneumatically controlled via a suitable external fluid pressure supply device such as an air compressor.

SUMMARY OF THE INVENTION

The above and other objects are provided by a slide actuated holding clamp apparatus in accordance with a preferred embodiment of the present invention. The apparatus generally comprises a body portion having a bore therethrough. A portion of the body portion further opens onto a lower surface of the body portion. A locking member is disposed within the body portion and includes a finger portion protruding outwardly therefrom. An actuating member is slidably disposed within the body portion and is operable to urge the locking finger portion of the locking member outwardly as the actuating member is moved in a first direction, and to cause the locking finger portion to be retracted to a position within the body portion when the actuating member is moved slidably in a second direction. For causing the actuating member to be moved in the first and second directions a fluid responsive actuating cylinder is included. The actuating cylinder is coupled to the actuating member and causes the actuating member to move in the first and second directions in response to the application and removal of fluid pressure to the actuating cylinder. In the preferred embodiment of the present invention the actuating cylinder comprises an air cylinder.

In the preferred embodiment of the present invention the locking member is further secured within the main body portion via a pivot pin. The locking member is caused to pivot about the pivot pin as the actuating member is moved slidably in the first and second directions by the air cylinder.

In the preferred embodiment the actuating member further includes a pin member extending generally transversely therethrough, and the locking member further includes a lower shoulder portion. The pin member of the actuating member operates to engage the lower shoulder portion when the actuating member is moved slidably in the second direction, which in turn causes the locking member to pivot about the pivot pin, thereby causing the locking finger portion to be retracted to a position within the main body portion.

The preferred embodiment of the present invention is capable of holding a connector securely with a minimum amount of force applied by the components of the apparatus, while a relatively large push force is applied to conductors releasably secured to the connector, and even when the push force ranges from 100 to 200 pounds or more. The preferred embodiment of the present invention further enables a smaller than heretofore normally required air cylinder for holding a connector stationary while a relatively large push force is exerted on a conductor releasably coupled to the connector.

BRIEF DESCRIPTION OF THE DRAWINGS

The various advantages of the present invention will become apparent to one skilled in the art by reading the following specification and subjoined claims and by referencing the following drawings in which:

FIG. 1 is a perspective view of a slide actuated holding clamp apparatus in accordance with a preferred embodiment of the present invention;

FIG. 2 is an elevational side view of the apparatus of FIG. 1;

FIG. 3 is a side cross sectional view of the apparatus of FIG. 2 taken in accordance with section line 3—3 in FIG. 2 showing the apparatus with its locking member retracted and positioned to secure a connector thereto;

FIG. 4 is a view of the apparatus of FIG. 3 showing the locking member after it has been urged into locking engagement with the connector; and FIG. 5 is an end view of the apparatus of FIG. 1.

DETAILED DESCRIPTION OF THE REFERRED EMBODIMENT

Referring to FIGS. 1 through 5, a slide actuated holding clamp apparatus 10 in accordance with a preferred embodiment of the present invention is illustrated. The apparatus 10 generally comprises a body portion 12 having body members 12a and 12b, a locking member 14 (FIGS. 3 and 4), a slidable actuating member 16, and a fluid responsive flow cylinder 18 which, in the preferred embodiment, may comprise a conventional, pneumatically actuated air cylinder.

Referring to FIGS. 2 and 5, the body members 12a and 12b are secured releasably together via a pair of threaded screws 20 which extend through body member 12a into threaded apertures 22 in body member 12b. While the body portion 12 has been shown in a two piece configuration, it will be appreciated that a single piece body member could be employed if so desired, and that a two piece design merely simplifies somewhat the assembly of the apparatus 10. In FIGS. 3 and 4, the apparatus 10 is shown releasably secured to a mounting block 24. This is accomplished preferably via a pair of threaded screws, such as threaded screws 26 shown in FIGS. 2 and 5. Electrical connectors 28a and 28b are also illustrated. Connector 28a has a terminal 30 electrically connected to a conductor 32 in the form of a wire. Connector 28b includes a terminal pin 29 biased upwardly by a spring 29a of sufficient construction to generate an upward push force of about 5 pounds as it is compressed.

With reference to FIGS. 2-4, the body member 12a of body portion 12 includes a bore 34 extending generally longitudinally through a midpoint thereof. Body member 12b includes an opening forming a channel 36 which opens onto a lower surface 38 thereof. The channel 36 and bore 34 are further longitudinally aligned when the body members 12a and 12b are releasably secured together. Referring to FIGS. 3 and 4, disposed within the channel 36 is the locking member 14. Locking member 14 includes an upper end 39 having a locking finger portion 40 which extends perpendicularly relative to the body portion 12 and outwardly of the channel 36 when the locking member 14 is positioned as shown in FIG. 4. The locking member 14 further includes a generally planar wall portion 42 having a channel 42a extending longitudinally therealong. A portion 16a of the actuating member 16 extends within the channel 42a. A lower end portion 46 of the locking member 14 includes a lower shoulder portion 46a which protrudes into the channel 36 to a position closely adjacent a bottom wall 36a of the channel 36 when the locking member 14 is positioned with the locking finger portion 40 extending outwardly of the channel 36.

A pivot pin 50 extends through the lower end portion 46 of the locking member 14 and transversely through the second body member 12b to enable the locking member 14 to move pivotally relative to the body portion 12. The actuating member 16 also includes a pin member 52 extending transversely therethrough and positioned to abuttingly engage the planar wall portion 42 of the locking member 14 when the locking member 14 has been moved in a first direction to a position near the upper end 39 of the locking member 14, as shown in FIG. 4.

The air cylinder 18 is coupled to the actuating member 16 via a linkage rod 58 which is secured threadably to a clevis 55. The clevis includes an aperture 56 which extends transversely therethrough. A coupling pin 54 extends through the aperture 56 in the clevis 57 and through a bore 59 in the actuating member 16 (also shown in FIG. 2). Accordingly, linear movement of the linkage rod 58 by the air cylinder 18 causes a corresponding linear movement of the actuating member 16.

With brief reference again to FIG. 2, the air cylinder 18 is illustrated as having a first air supply conduit 60 and a second air supply conduit 62. First air supply conduit 60 enables pressurized air to be applied to a first side of a piston (not shown) within the air cylinder 18, to thereby urge the piston upwardly in a first direction toward the locking member 14. The second conduit 62 enables pressurized air to be applied to the opposite side of the piston to cause the piston to be urged in a longitudinally opposite second direction, or away from the locking member 14. It will be appreciated, however, by those skilled in the art that numerous, conventional fluid responsive mechanisms may be employed to provide pressurized air and/or a vacuum to cause the piston within the air cylinder 18 to move in the first and second directions. Additionally, it will be appreciated that well known electrically energized solenoids may also be employed to perform the operation of air cylinder 18.

Turning now to the operation of the apparatus 10, when air pressure is first applied to first air supply conduit 60, the piston within the air cylinder 18 is driven upwardly in the first direction causing the linkage rod 58, clevis 55 and the actuating member 16 to be driven in the first direction into the position shown in FIG. 4. As the actuating member 16 is driven slidably upwardly in the first direction along a bottom wall 36a of the channel 36, the outer surface of the pin member 52 slidably moves along the planar wall portion 42 of the locking member 14, thus urging the upper end portion 39 of the locking member 14 clockwise (when viewing FIGS. 3 and 4), to thereby urge the locking finger portion 40 outwardly of the channel 36. The locking finger portion 40 engages an edge portion 31 of the connector 28a to forcibly urge the connector 28a downwardly against the terminal pin 29 and the counteracting push force of spring 29a. The locking finger portion 40 thus releasably secures the connector 28a stationary while the push force is exerted upwardly on the terminal pin 29 by spring 29a against terminal 30. If the terminal 30 is not seated securely within the connector 28a the terminal 30 will be forced upwardly by the terminal pin 29 out of the connector 28a.

It should be appreciated that when the actuating member 16 is extended fully in the first direction, thus urging the locking finger portion 40 outwardly, only a very small force will be required to be exerted on the actuating member 16 in the first direction in order to maintain the locking member 14 in the position shown in FIG. 4. This will be so even though a relatively large total push force, for example, 100 to 200 pounds, is exerted on the connector 28a. Thus, a relatively large air cylinder 18 is not required. Accordingly, an air cylinder having a much smaller diameter and more compact shape may be employed which would otherwise not be possible with prior art holding clamp mechanisms.

With reference to FIG. 3, when the locking finger portion 40 is to be retracted, air pressure is supplied through the second air supply conduit 62 which applies air pressure to a side of the piston within the air cylinder 18 opposite to the side of the piston to which air pressure was supplied via air supply conduit 60. It will also be appreciated that at this point the first air supply conduit 60 will by some conventional means (e.g., a three-way valve) be vented to atmosphere to enable the piston within the air cylinder 18 to moved in the second direction away from the body portion 12a.

When air pressure is supplied through the second air supply conduit 62, it causes the piston within the air cylinder 18 to move downwardly in the second direction, thus moving the clevis 55 and the actuating member 16 downwardly in the second direction. The pin member 52 of the actuating member 16 moves slidably down the planar wall portion 42 into abutting engagement with the lower shoulder portion 46a of the locking member 14. The pin member 52, as it continues downwardly in the second direction, forces the lower shoulder portion 46a to move pivotally in a counter clockwise manner, when viewing FIG. 3, about pivot pin 50. This causes the locking finger portion 40 to be retracted to a position within the channel 36 of the body portion 12. At this point the connector 28a may be removed and a different connector positioned for another push test.

Accordingly, the apparatus 10 of the present invention provides a slide actuated holding clamp which may be constructed in accordance with conventional construction techniques relatively simply and inexpensively from widely available materials such as aluminum or steel. For strength purposes it is preferred that the locking member 14 be constructed f rom steel, and preferably heat treated for even further strength. The apparatus of the present invention further enables push tests to be conducted on connectors where a relatively large total push force is required to be exerted, without the use of relatively large diameter air cylinders which detract from the compactness of the holding clamp, and which typically add to the overall cost of the holding clamp.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification and following claims.

What is claimed is:

1. A slide actuating holding clamp apparatus for holding a connector stationary while a push test is being performed on at least one conductor secured to said connector, said apparatus comprising:

a body portion having a bore extending at least partially therethrough and an opening formed in a lower surface of said body portion, said opening extending through said body portion into communication with said bore;

a locking member disposed within said opening of said body portion, said locking member including a locking finger portion extending generally perpendicularly outwardly of said lower surface of said body portion and a lower shoulder portion extending into said opening;

an actuating member disposed slidably within said opening;

pin means fixed associated with said actuating member for slidably engaging said locking member as said actuating member is moved in first and second longitudinally opposite directions;

said pin means of said actuating member causing said locking finger portion of said locking member to be moved outwardly relative to said body portion as said actuating member moves slidably in said first direction within said opening against said locking member, and causing said locking finger portion to be retracted into said opening when said actuating member is moved slidably in said second, longitudinally opposite direction within said opening along said locking member to cause said pin means to abuttingly engage said lower shoulder portion of said locking member; and means coupled to said actuating member for causing said actuating member to move controllably slidably in said first and second directions within said bore.

2. The apparatus of claim 1, wherein said locking member is pivotally secured to said body portion via a pivot pin.

3. The apparatus of claim 1, wherein said actuating member includes a transversely extending pin member;

wherein said locking member includes a generally planar wall portion;

wherein said pin member abuttingly engages said planar wall portion of said locking member as said actuating member is urged slidably in said first direction, thereby causing said locking finger portion to be urged outwardly of said body portion; and wherein said pin member abuttingly engages said lower shoulder portion of said locking member when said actuating member is moved in said second direction to thereby cause said locking member to move pivotally to retract said locking finger portion.

4. The apparatus of claim 1, wherein said means for causing said actuating member to move slidably comprises fluid responsive cylinder means for causing said actuating means to move slidably in said first and second directions in response to the application and withdrawal of fluid pressure thereto.

5. The apparatus of claim 4, wherein said fluid responsive cylinder means comprises an air cylinder.

6. The apparatus of claim 1, further comprising a linkage rod coupled to said air cylinder and a clevis intercoupled between said linkage rod and said actuating member.

7. A slide actuated holding clamp apparatus for holding a connector stationary while a push test is performed on a conductor secured to said connector, said apparatus comprising:

a body portion having a bore extending generally longitudinally therethrough, at least a portion of said bore opening into a lower wall portion of said body portion to form a channel in said body portion;

a locking member pivotally coupled in said channel portion, said locking member having a locking finger portion protruding outwardly from an upper end of said body portion and a lower shoulder portion extending into said channel at a lower end portion of said locking member;

an actuating member disposed slidably within said bore, said actuating member having a pin member extending generally transversely therethrough;

fluid cylinder means for urging said actuating member slidably within said bore in first and second directions in response to the application and removal of fluid pressure thereto, said pin member of said actuating member abuttingly urging said locking member to cause said locking member to move pivotally, to thereby cause said locking finger portion to be urged outwardly of said body portion into locking engagement with said connector when said actuating member is moved in said first direction, said pin member further operating to abuttingly engage said lower shoulder portion of said locking member when said actuating member is moved in said second direction, thereby causing said locking member to be moved pivotally such that said locking finger portion is retracted to a position within said channel.

8. The apparatus of claim 7, wherein said fluid cylinder means comprises an air cylinder.

9. The apparatus of claim 8, further comprising a clevis intercoupled between said actuating member and said air cylinder.

10. The apparatus of claim 9, wherein said clevis is coupled to said actuating member via a coupling pin.

11. The apparatus of claim 7, wherein said body portion comprises:
a first body member;
a second body member; and
means for releasably securing said first and second body members together.

12. The apparatus of claim 11, wherein said channel extends longitudinally the entire length of said second body member.

13. A slide actuated holding clamp apparatus for holding a connector securely while a push test is conducted on a conductor secured to said connector, said apparatus comprising:

a first body member having a bore extending longitudinally therethrough;

a second body member releasably secured to said first body member and including a channel extending therealong in communication with said bore;

a locking member disposed within said channel, said locking member having a generally planar wall portion and upper and lower end portions, said upper end portion having a locking finger portion protruding outwardly of said channel and said lower end portion including a lower shoulder portion protruding toward a bottom wall of said channel;

a pivot pin extending through a portion of said lower end portion and said second body member for enabling said locking member to move pivotally relative to said channel;

an actuating member disposed slidably within said channel of said second body member;

a pin member extending transversely through an upper end portion of said actuating member, said pin member being further positioned such that an outer surface thereof abuttingly engages said planar wall portion of said locking member as said actuating member moves slidably in a first direction, thereby urging said upper end portion of said locking member pivotally outwardly of said channel to cause said locking finger portion to protrude outwardly of said channel, and for abuttingly engaging said lower shoulder portion when said actuating member is moved slidably in a second, longitudinally opposite direction, thereby causing said lower end portion of said locking member to be moved pivotally outwardly relative to said bottom wall of said channel, thereby causing said locking finger portion to be retracted to a position within said channel;

an actuating air cylinder; and a clevis intercoupled between said actuating cylinder and said actuating member, said actuating air cylinder being operable to move said actuating member slidably in said first and second directions in response to the application of fluid pressure thereto.

14. The apparatus of claim 13, further comprising a coupling pin for coupling said clevis to a linkage rod, said linkage rod in turn being secured to said air cylinder.

* * * * *

UNITED STATES PATENT AND TRADEMARK OFFICE
CERTIFICATE OF CORRECTION

PATENT NO. : 5,277,411
DATED : January 11, 1994
INVENTOR(S) : George L. Justus

It is certified that error appears in the above-indentified patent and that said Letters Patent is hereby corrected as shown below:

Column 3, line 17, "REFERRED" should be --PREFERRED--.
Column 5, line 45, "f rom" should be --from--.
Column 6, line 14, claim 1, "fixed" should be --fixedly--.
Column 6, line 61, claim 6, "Claim 1" should be --Claim 5--.

Signed and Sealed this

Twenty-first Day of June, 1994

Attest:

BRUCE LEHMAN

*Attesting Officer*    *Commissioner of Patents and Trademarks*